(12) United States Patent
Shimizu et al.

(10) Patent No.: US 6,330,205 B2
(45) Date of Patent: Dec. 11, 2001

(54) VIRTUAL CHANNEL SYNCHRONOUS DYNAMIC RANDOM ACCESS MEMORY

(75) Inventors: Yoshiaki Shimizu; Kazuhiko Matsuki, both of Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/741,419

(22) Filed: Dec. 21, 2000

(30) Foreign Application Priority Data

Dec. 22, 1999 (JP) .................................................. 11-365629

(51) Int. Cl.$^7$ .................................................. G11C 13/00
(52) U.S. Cl. .................. 365/230.06; 365/51; 365/189.07
(58) Field of Search .................. 365/51, 189.07, 365/63, 200, 230.06

(56) References Cited

U.S. PATENT DOCUMENTS 5,148,397 * 9/1992 Kokubum .............................. 365/185

* cited by examiner

*Primary Examiner*—Terrell W. Fears
(74) *Attorney, Agent, or Firm*—Young & Thompson

(57) ABSTRACT

The present invention provides a semiconductor memory device comprising: memory cells; main decoders decoding address signals sense amplifiers for reading out informations from the memory cells; and word drivers for driving the memory cells, wherein a row address controlled by a single main word line in a basic cell in the word driver, and two of the main word line of the row address are made correspond to a half of lower-order 2-bits of the row address, and a word driver signal is placed inside of the basic cell of the word driver to prevent the word driver signal from being commonly used to adjacent two of the basic cell.

12 Claims, 10 Drawing Sheets

VIRTUAL CHANNEL SYNCHRONOUS DYNAMIC RANDOM ACCESS MEMORY

BACKGROUND OF THE INVENTION

The present invention relates to a semiconductor memory device, and more particularly to a virtual channel synchronous dynamic random access memory.

A conventional virtual channel synchronous dynamic random access memory is disclosed in Japanese laid-open patent publication No. 8-180698. Operations of the conventional virtual channel synchronous dynamic random access memory will be described with reference to the drawings. FIG. 1 is a view illustrative of an array structure of the conventional virtual channel synchronous dynamic random access memory. The conventional virtual channel synchronous dynamic random access memory has the array structure of memory cells (M-CELL), main decoders (XDEC) 34, sense amplifiers (SA) 32, word drivers (WDRV) 31 and cross sections (CROSS) 36.

FIG. 2 is a fragmentary enlarged view illustrative of a partial array structure surrounded by a broken line 35 of the conventional virtual channel synchronous dynamic random access memory shown in FIG. 1. Four memory cells (M-CELL) 43 are separated by a cross section (CROSS) 49, word drivers (WDRV) 41, and sense amplifiers (SA) 42. Each of the word drivers (WDRV) 41 comprises repeated basic word driver cells (WDRV) and a redundancy word driver (RED-WDRV) 46. Each of the sense amplifiers (SA) 42 comprises repeated basic sense amplifier cells (SA) and a redundancy sense amplifier (RED-SA) 45. FIG. 3 is a circuit diagram illustrative of a circuit configuration of a basic word driver cell included in the word driver shown in FIG. 2. The basic word driver cell has a first input of a single MainWord outputted from the main decoder (XDEC) 44 and second to fifth inputs of four RA signals (RA1, RA2, RA3, and RA4) as well as first to fourth outputs (WD1-m1, WD2-m1, WD3-m1, and WD4-m1) of Words corresponding to 2-bits from least significant of Row address.

The size o the basic word driver cells of the word driver (WDRV) 41 depends on a pitch of word lines extending over the memory cell (M-CELL) 43.

In order to reduce the height of the basic word driver cell and further to accommodate the four RA signals into the basic word driver cell, the word driver (WDRV) is structured so that basic word driver cells of the adjacent word drivers 53 and 54 are symmetrically arranged with reference to a line and an RA signal is commonly used for the adjacent two basic word driver cells of the adjacent word drivers 53 and 54. FIG. 4A is a circuit diagram illustrative of the symmetrical arrangements of the basic word driver cells of the adjacent word drivers. FIG. 4B is a circuit diagram illustrative of word driver basic cells and an adjacent redundancy word driver basic cell in the arrangements of FIG. 4A. FIG. 5 is a schematic view illustrative of a conventional semiconductor memory device having an alternating alignment of the word drivers and the memory cells, wherein one of main-words is replaced with a redundancy (RED) 81. Namely, in the prior art, if any defective bit is present in the memory cell accessible from the single Word, then the Main-Word having the defective bit is not used, and in place, the defective Main-Word is changed into a redundancy Main-Word for the redundancy.

It is, however, necessary for this conventional method to switch not only the defective Word but also the non-defective Word which uses the same Main Word as the defective Word. This means that the replacement efficiency is deteriorated.

In accordance with the virtual channel synchronous dynamic random access memory, in order to have solved the above disadvantage, the RA signal of the redundancy word driver is separated from the RA signal of the word driver, so that both the defective Main-Word and the redundancy Main-Word are used to switch the RA signal only to the defective Word, whereby only the defective Word is selectively replaced with the redundancy Word (RED).

As described above, in accordance with the virtual channel synchronous dynamic random access memory, the RA signal of the redundancy word driver is separated from the RA signal of the word driver, for which reason it is difficult that the RA signal is commonly used for the word driver and the redundancy word driver.

FIG. 6A is a schematic diagram illustrative of the conventional structure of the word driver (WDRV) and a redundancy word driver (RED-WDRV) adjacent to the word driver. FIG. 6B is a diagram illustrative of the conventional placement of the semiconductor memory device. The word driver (WDRV) and the redundancy word driver (RED-WDRV) are separated by a distance (2a+2b). The above conventional technique has the following two problems.

First, the distance between the word driver (WDRV) and the redundancy word driver (RED-WDRV) is widen, whereby structural elements of the redundancy word driver (RED-WDRV) and interconnections extending over the cross region (CROSS). It is difficult that the signal in the sense amplifier SA passes through the cross region (CROSS). A device formation region in the cross region (CROSS) is also reduced.

Second, a displacement of the redundancy word driver (RED-WDRV) causes that a Word-input position of the memory cell M-CELL and a Word-output position of the redundancy word driver (RED-WDRV) are displaced by the distance (2a+2b).

In the above circumstances, it had been required to develop a novel semiconductor memory device free from the above problem.

SUMMARY OF THE INVENTION

Accordingly, it is an object of the present invention to provide a novel semiconductor memory device free from the above problems.

It is a further object of the present invention to provide a novel virtual channel synchronous dynamic random access memory free from the above problems.

The present invention provides a semiconductor memory device comprising : memory cells; main decoders decoding address signals; sense amplifiers for reading out informations from the memory cells; and word drivers for driving the memory cells, wherein a row address controlled by a single main word line in a basic cell in the word driver, and two of the main word line of the row address are made correspond to a half of lower-order 2-bits of the row address, and a word driver signal is placed inside of the basic cell of the word driver to prevent the word driver signal from being commonly used to adjacent two of the basic cell.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a semiconductor memory device comprising : memory cells; main decoders decoding address signals; sense amplifiers for reading out informations from the memory cells; and word drivers for driving the memory cells, wherein a row address controlled by a single main word line in a basic cell in the word driver, and two of the main word line of the row address are made correspond to a half of lower-order 2-bits of the row address, and a word driver signal is placed inside of the basic cell of the word driver to prevent the word driver signal from being commonly used to adjacent two of the basic cell.

It is preferable that two of the main word line are placed cross to each other, a remaining half of the lower-order 2-bits of the row address is controlled by an adjacent basic cell of the word driver, and the single basic cell of the word driver has different two main word lines having the same lower-order bits.

It is preferable that the word river signal is placed at almost center position of the basic cell of the word driver.

It is preferable that the semiconductor memory device comprises a virtual channel synchronous dynamic random access memory.

It is preferable that a redundancy word line is provided in correspondence with the main word line.

It is further preferable that the redundancy word line includes a plurality of the main word line.

The second present invention provides a word driver structure of a semiconductor memory device, wherein a row address controlled by a single main word line in a basic cell in the word driver, and two of the main word line of the row address are made correspond to a half of lower-order 2-bits of the row address, and a word driver signal is placed inside of the basic cell of the word driver to prevent the word driver signal from being commonly used to adjacent two of the basic cell.

It is preferable that two of the main word line are placed cross to each other, a remaining half of the lower-order 2-bits of the row address is controlled by an adjacent basic cell of the word driver, and the single basic cell of the word driver has different two main word lines having the same lower-order bits.

It is preferable that the word river signal is placed at almost center position of the basic cell of the word driver.

It is preferable that the semiconductor memory device comprises a virtual channel synchronous dynamic random access memory.

It is preferable that a redundancy word line is provided in correspondence with the main word line.

It is preferable that the redundancy word line includes a plurality of the main word line.

PREFERRED EMBODIMENT

Figure 7:
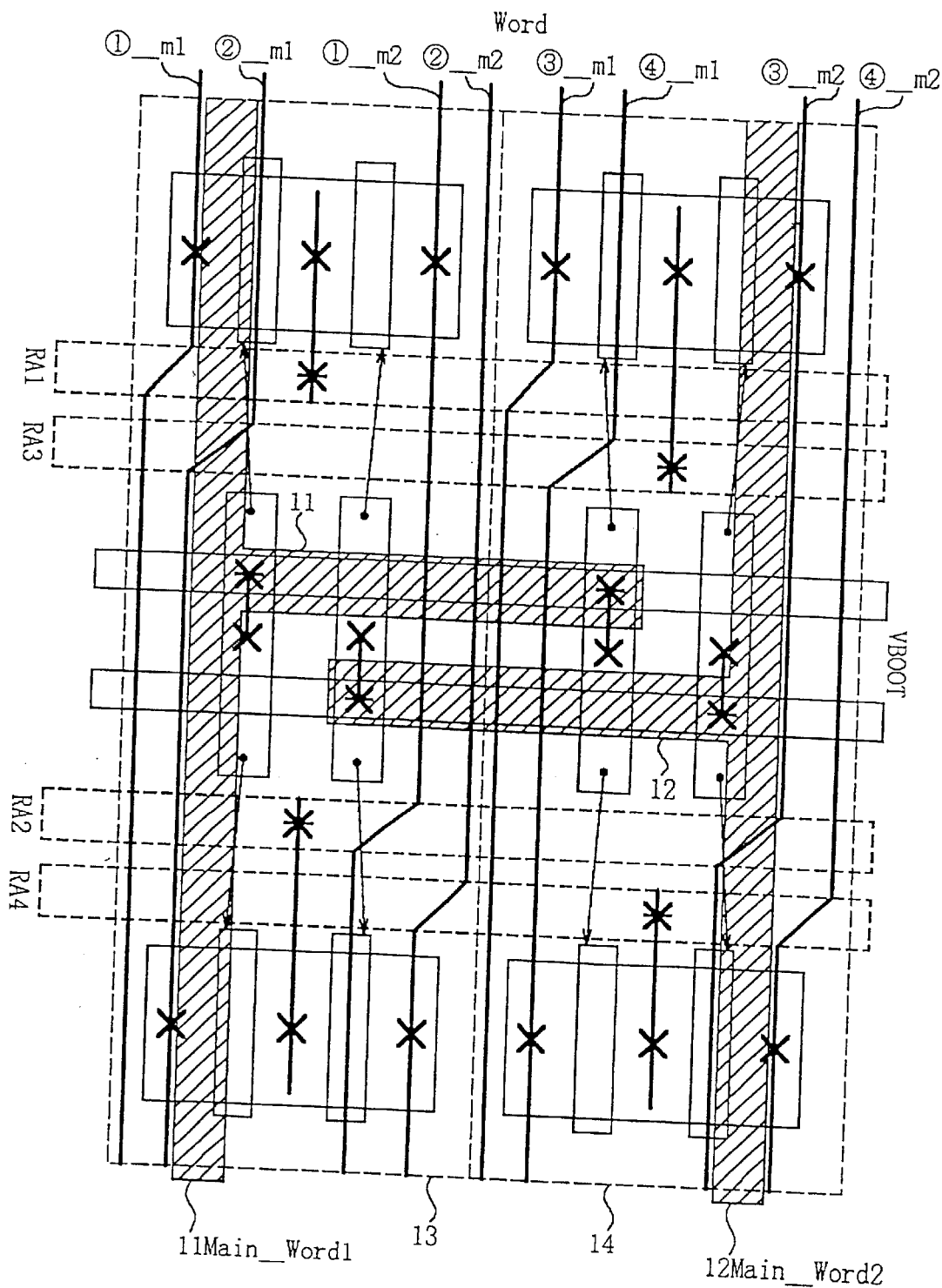
FIG. 7 is a block diagram illustrative of a novel semiconductor memory device in a first embodiment in accordance with the present invention.
Figure 8:
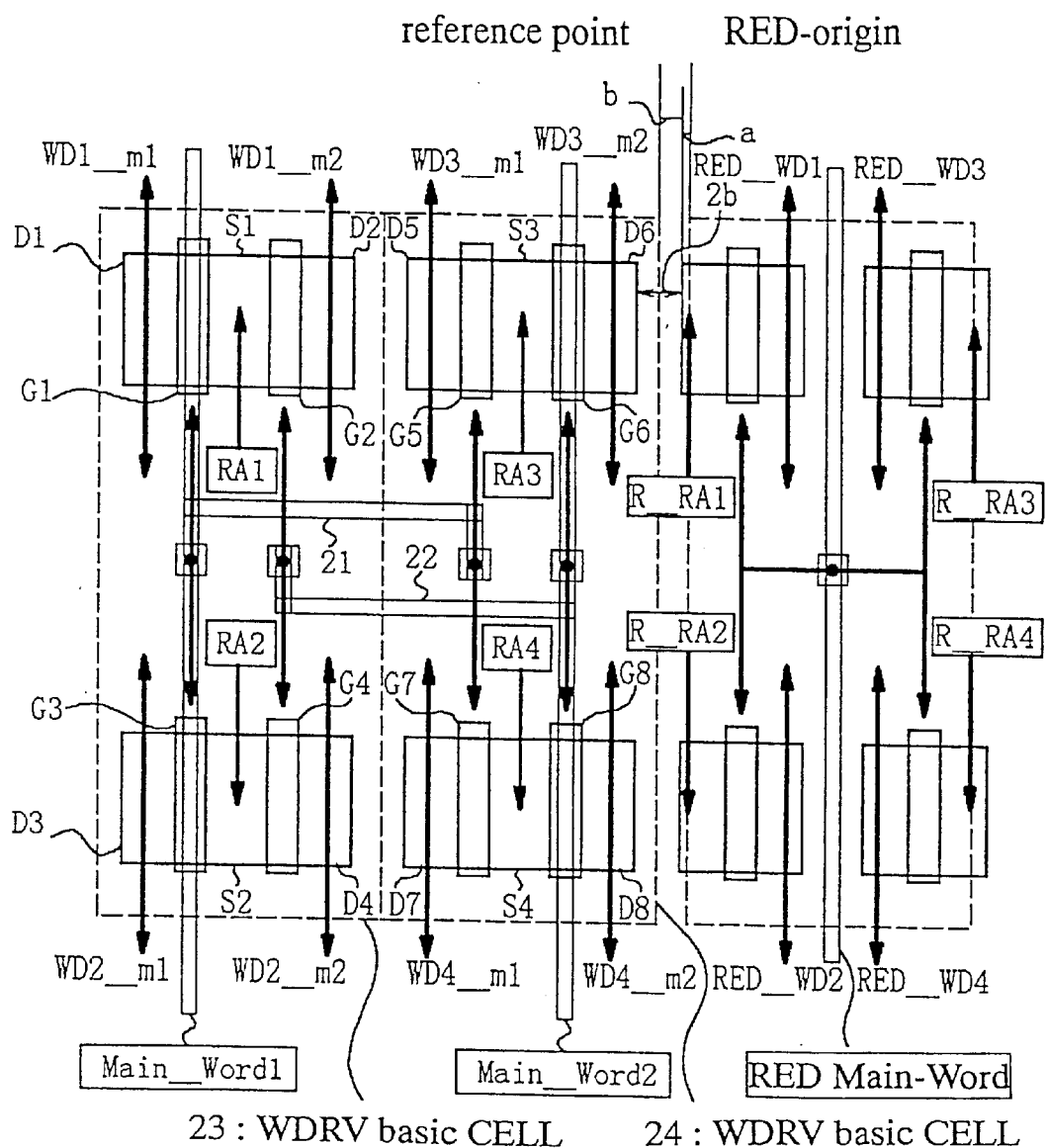
FIG. 8 is a block diagram partially illustrative of a redundancy part of the novel semiconductor memory device of FIG. 7.

A first embodiment according to the present invention will be described in detail with reference to the drawings. FIG. 7 is a block diagram illustrative of a novel semiconductor memory device in a first embodiment in accordance with the present invention. FIG. 8 is a block diagram partially illustrative of a redundancy part of the novel semiconductor memory device of FIG. 7.

With reference to FIG. 7, the novel semiconductor memory device has the following word driver basic cell structure. Adjacent two word driver basic cells (13, 14) have eight Word-lines (①-m1, ②-m1, ③-m1, ④-m1, ①-m2, ②-m2, ③-m2, ④-m2), driving signals (RA1, RA2, RA3 and RA4) which correspond to low-order two bits of the Row-address and Main-Word1(11) and Main-Word2(12) as selecting signals of the high-order bits of the Row address.

With reference to FIG. 8, the two word driver basic cells (23, 24) are placed adjacent to each other. The two word driver basic cells (23, 24) comprise the eight Word-lines (WD1-m1, WD2-m1, WD3-m1, WD4-m1, WD1-m2, WD2-m2, WD3-m2, WD4-m2), driving signals (RA1, RA2, RA3 and RA4) which correspond to low-order two bits of the Row-address and Main-Word1(11) and Main-Word2(12) as selecting signals of the high-order bits of the Row address, wherein the above driving signals (RA1, RA2, RA3 and RA4) are connected to sources (S1, S2, S3 and S4) of the transistors, and the above selecting signals Main-Word1(11) and Main-Word2(12) are connected to the gates (G1, G2, G3, G4, G5, G6, G7 and G8) of the transistor, and the Word lines (WD1-m1, WD2-m1, WD3-m1, WD4-m1, WD1-m2, WD2-m2, WD3-m2, WD4-m2) are connected to the drains (D1, D2, D3, D4, D5, D6, D7 and D8) of the transistors.

The word driver basic cell (23) and the word driver basic cell (24) are adjacent to each other. The word driver basic cell (23) has a driver transistor commonly having two sources (S1, S2) connected with the driver signals (RA1, RA2) which drive two Word lines corresponding to a half of the low-order two bits of the Row address, wherein the sources (S1, S2) are placed at a center position of the word driver basic cell.

The MainWord1 is connected to the gates (G1, G3) of the driver transistors. The MainWord2 in the adjacent word driver basic cell (24) is connected to the gates (G2, G4) of the driver transistors, so as to drive the four word lines (WD1-m1, WD2-m1, WD1-m2, WD2-m2) which correspond to a half of the low-order 2-bits of the Row address by use of different two Row address high-order bits in the word driver basic cell (23). In the word driver basic cell (24), two sets of the driver transistor is placed which commonly use the sources (S3, S4) connected with the remaining word driving signals. The Main Word2 is connected to the gates (G6, G8) of the driver transistor. The MainWord1 in the adjacent word driver basic cell (23) is connected to the gates (G5, G6) of the driver transistor, so as to drive the remaining four word lines (WD3-m1, WD4-m1, WD3-m2, WD4-m2).

Sequential processes for a placement and routine design will subsequently be described.

In a first step STEP1, if the word driver basic cells of the virtual channel synchronous dynamic random access memory are designed in accordance with the conventional placement and routine, then the driving signal RA is usually different from the redundancy driving signal RED-RA for driving the redundancy word line, for which reason it is difficult to make common the RA signal extending the boundary of the basic cells, whereby the distance between the normal word driver and the redundancy word driver.

In the second step STEP2, in order to solve the above disadvantage, the word driving signal RA is placed at a center of the basic cell.

In the third step STEP3, in order to place the word driving signal RA at the center of the basic cell without changing the height of the word driver basic cell, it is necessary that lower-order 2-bits of the Row address to be controlled by the single MainWord is made correspond to a half.

In the fourth step STEP4, the remaining half of the lower-order 2-bits of the Row address is placed in the adjacent basic cell.

In the fifth step STEP5, lower-order 2-bits of the Row address to be controlled by the adjacent MainWord is also made correspond to a half, so that the transistor is made common to both the same lower-order 2-bits.

In the sixth step STEP6, in order to realize the first step STEP5, the adjacent two MainWords extend cross to each other as shown in FIG. 8 to make a pair of the two adjacent basic cells, whereby the placement and routine deign is made to the semiconductor memory device.

As a modification, it is possible that the virtual channel synchronous random access memory has a redundancy portion (RED) comprising the single word driver basic cell. If, however, the redundancy portion (RED) comprises plural word driver basic cells, then the above novel structure of the present invention is applicable to the redundancy word driver. Particularly, the provision of the even number of the word driver basic cells is effective.

In summary, only two word lines as a half of the Row address lower-order 2-bits are controlled by the single MainWord in the word driver basic cell, and the word driving signal RA is placed at a center of the basic cell, even in accordance with the prior art, the word driving signal RA is placed at the boundary to be commonly used to the adjacent two basic cells bounded by the boundary.

Further, the adjacent two MainWords extend cross to each other as shown in FIG. 8 to make a pair of the two adjacent basic cells, so that the remaining half of the Row address lower-order 2-bits is controlled by the adjacent basic cell and further the single word driver basic cell has different two MainWords having the same lower-order bits.

Figure 1:
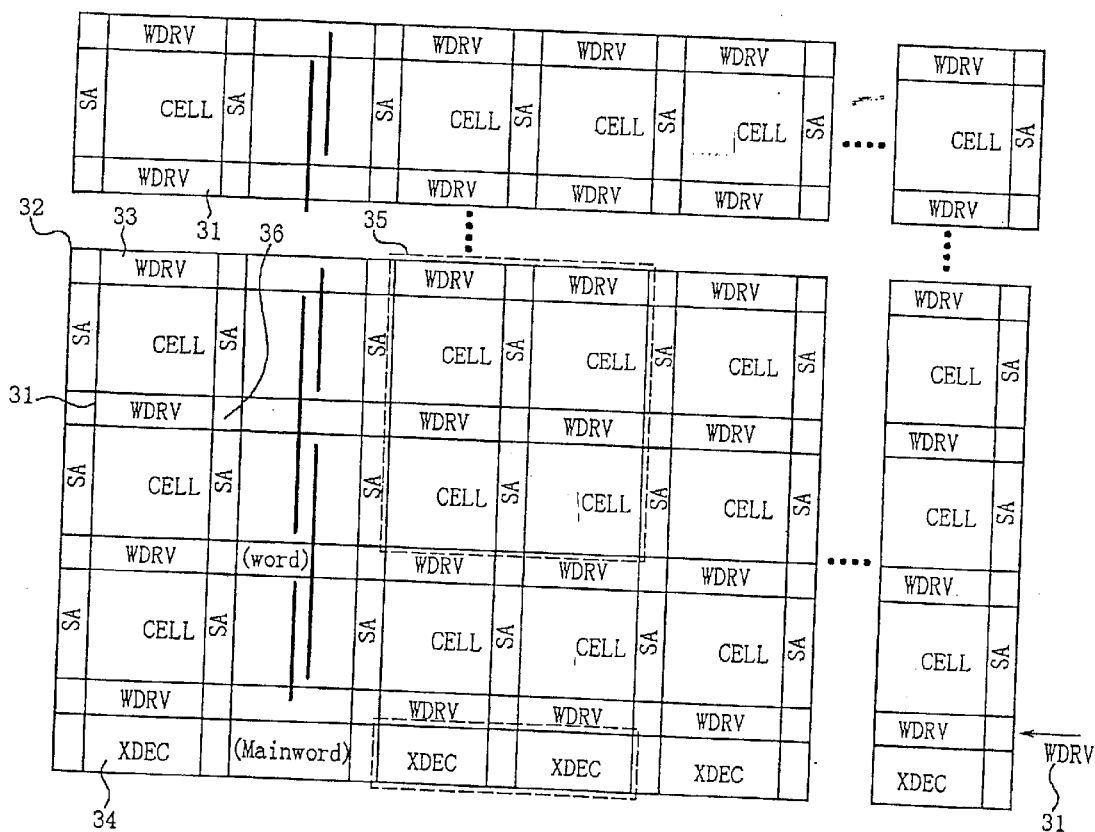
FIG. 1 is a view illustrative of an array structure of the conventional virtual channel synchronous dynamic random access memory.
Figure 2:
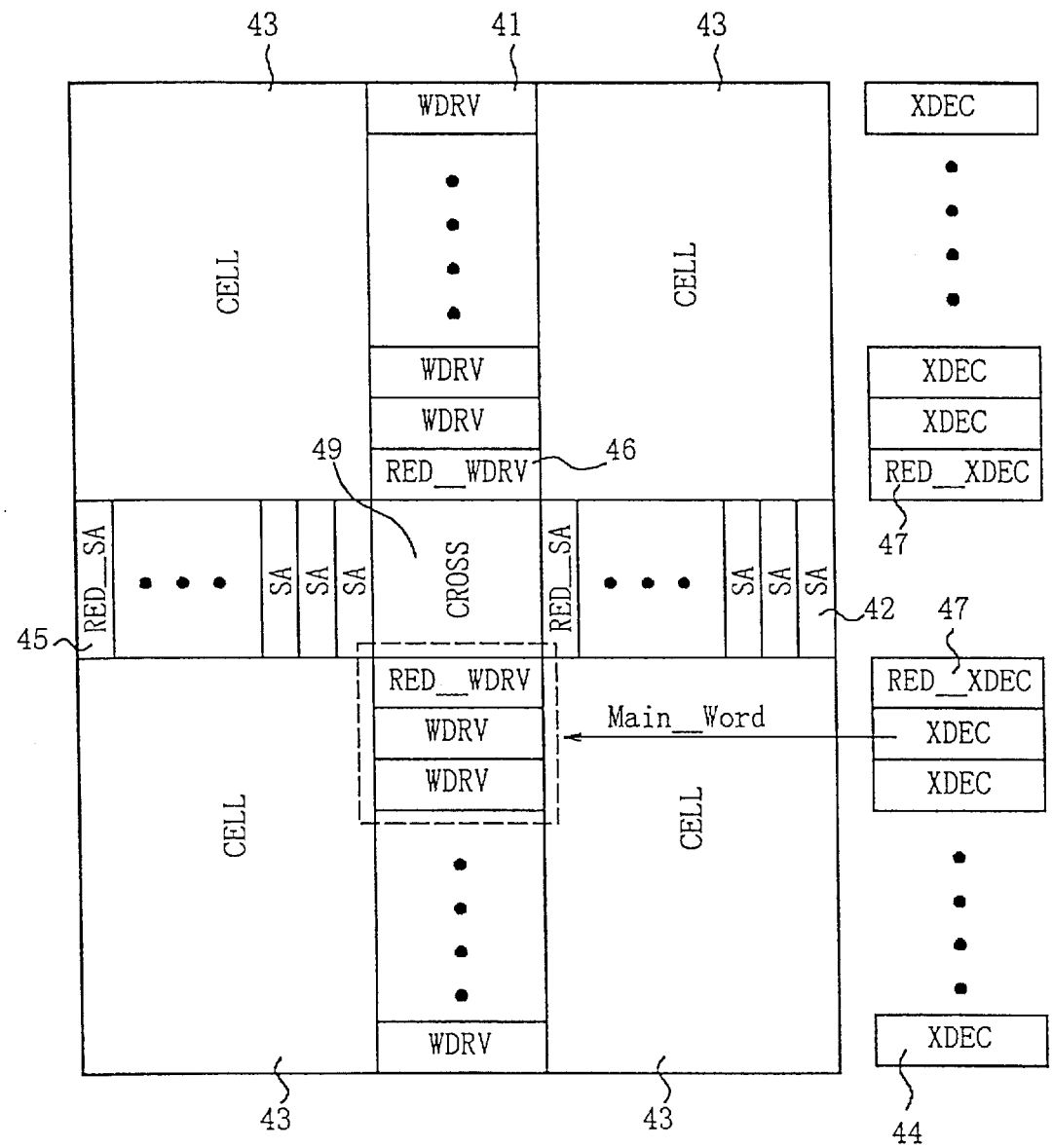
FIG. 2 is a fragmentary enlarged view illustrative of a partial array structure surrounded by a broken line of the conventional virtual channel synchronous dynamic random access memory shown in FIG. 1.
Figure 3:
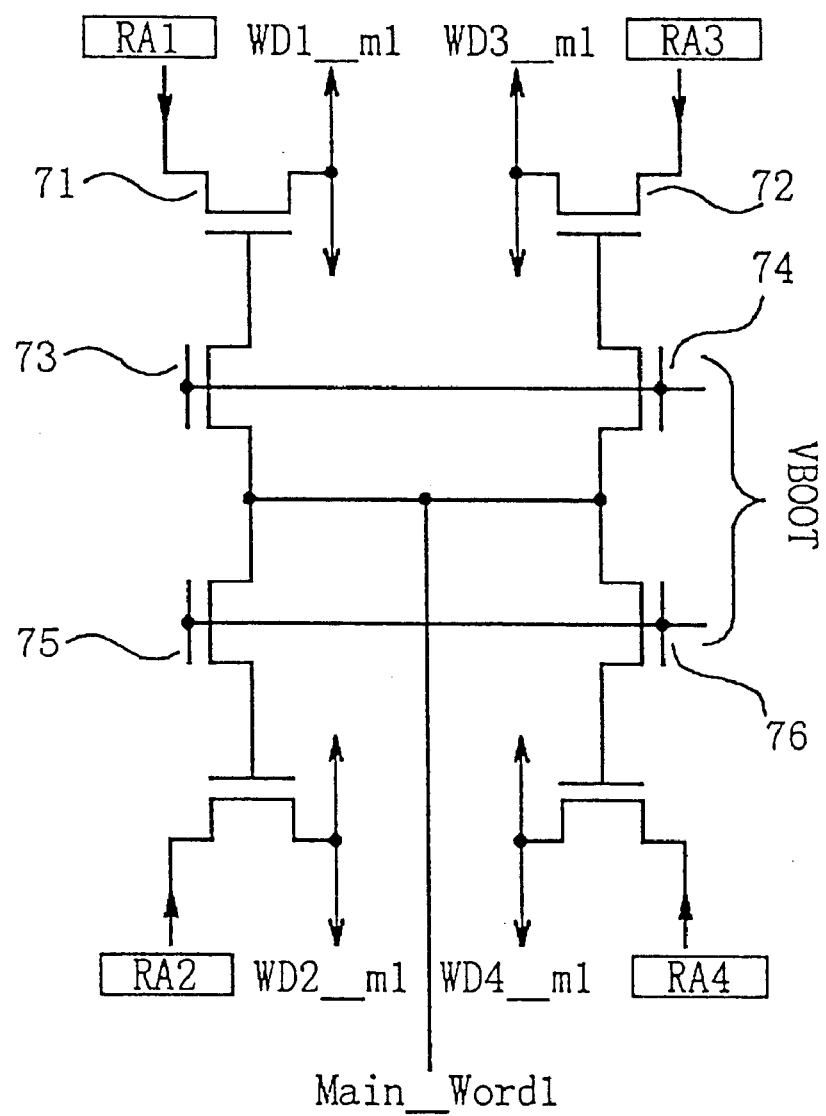
FIG. 3 is a circuit diagram illustrative of a circuit configuration of a basic word driver cell included in the word driver shown in FIG. 2.
Figure 4A:
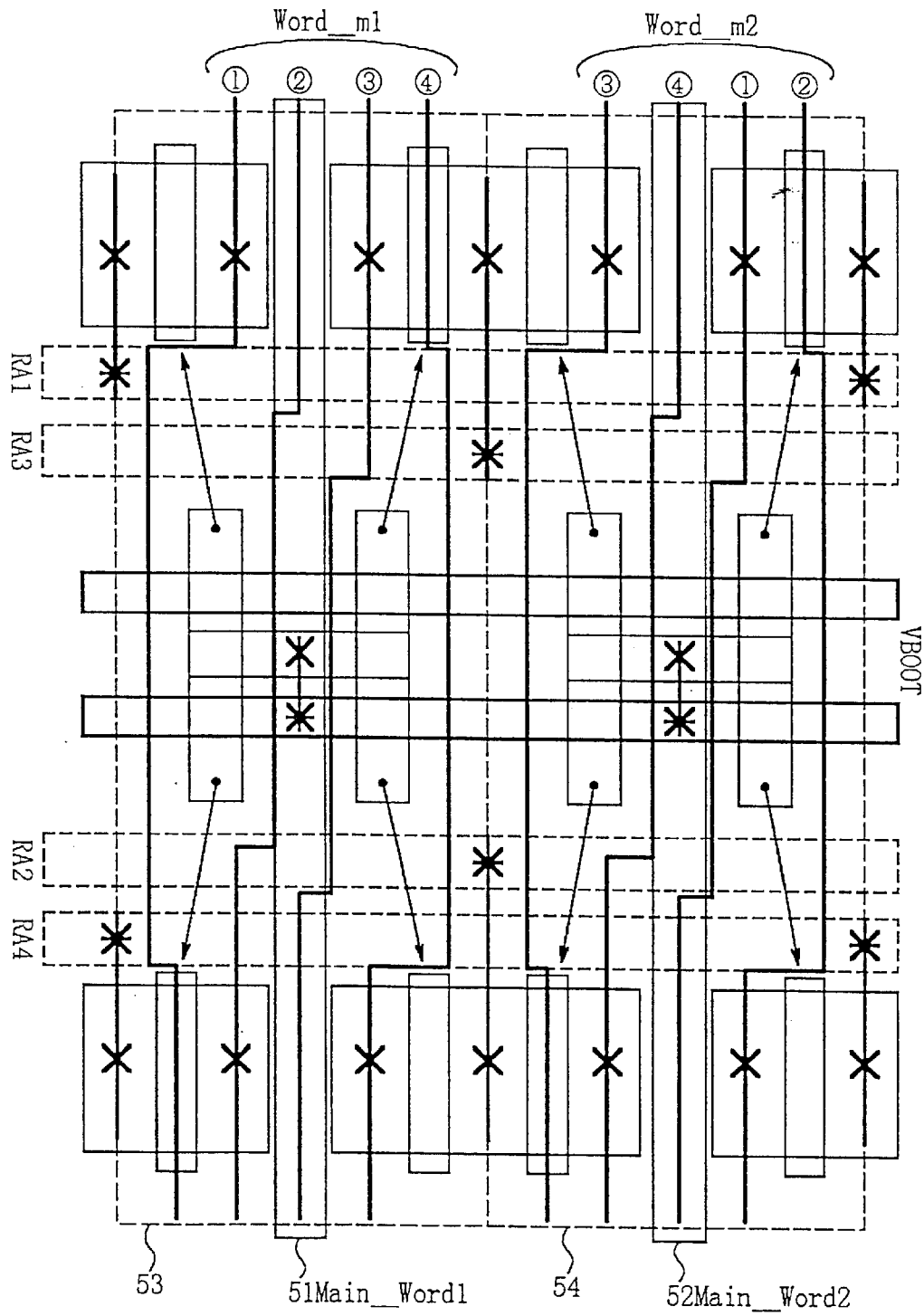
FIG. 4A is a circuit diagram illustrative of the symmetrical arrangements of the basic word driver cells of the adjacent word drivers.
Figure 4B:
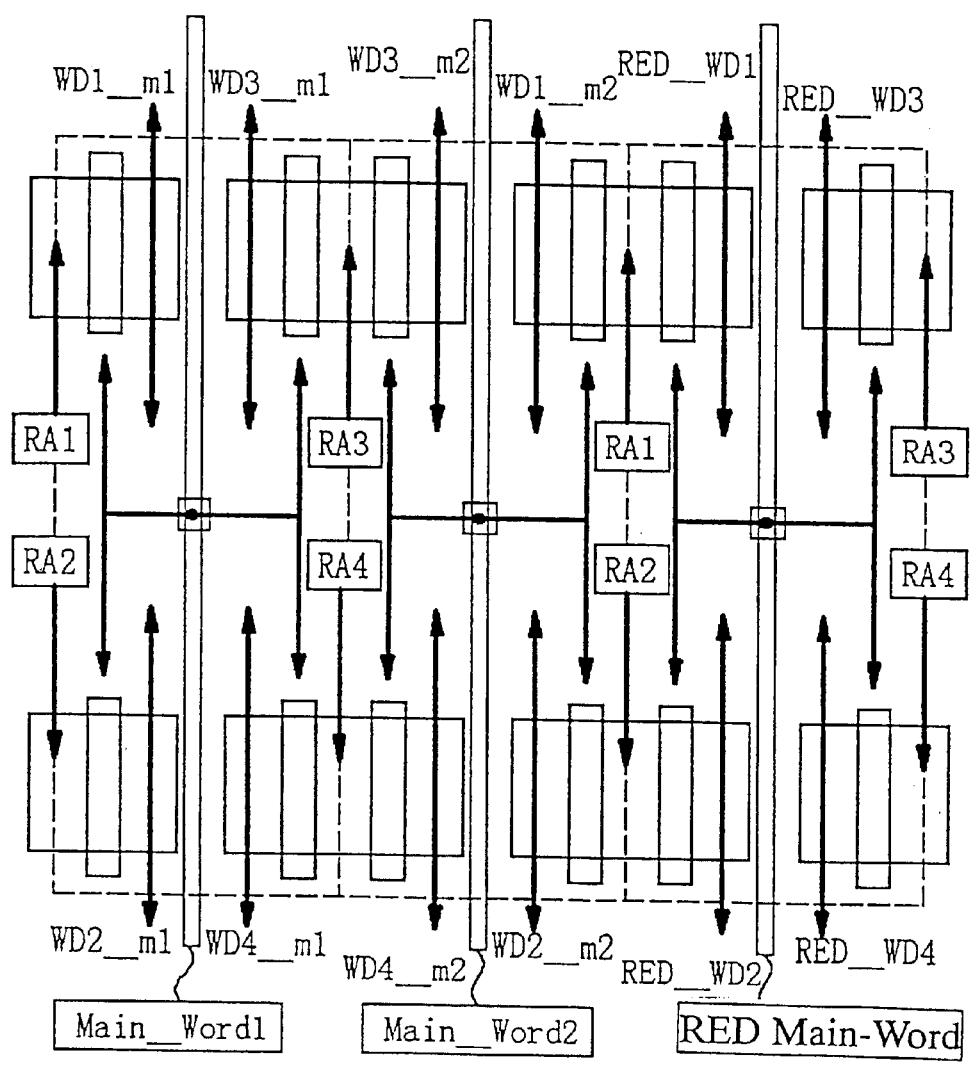
FIG. 4B is a circuit diagram illustrative of word driver basic cells and an adjacent redundancy word driver basic cell in the arrangements of FIG. 4A.
Figure 5:
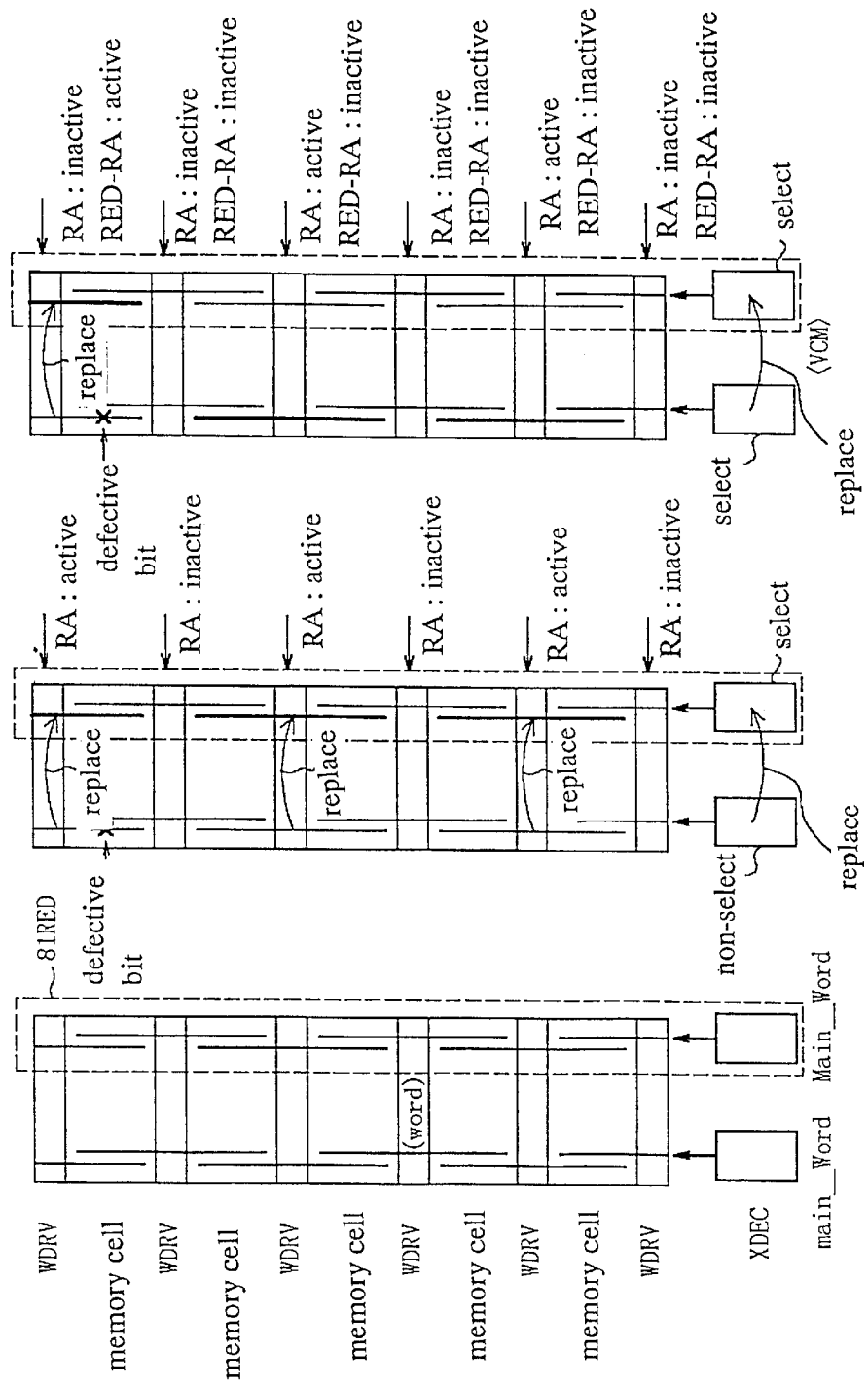
FIG. 5 is a schematic view illustrative of a conventional semiconductor memory device having an alternating alignment of the word drivers and the memory cells.
Figure 6A:
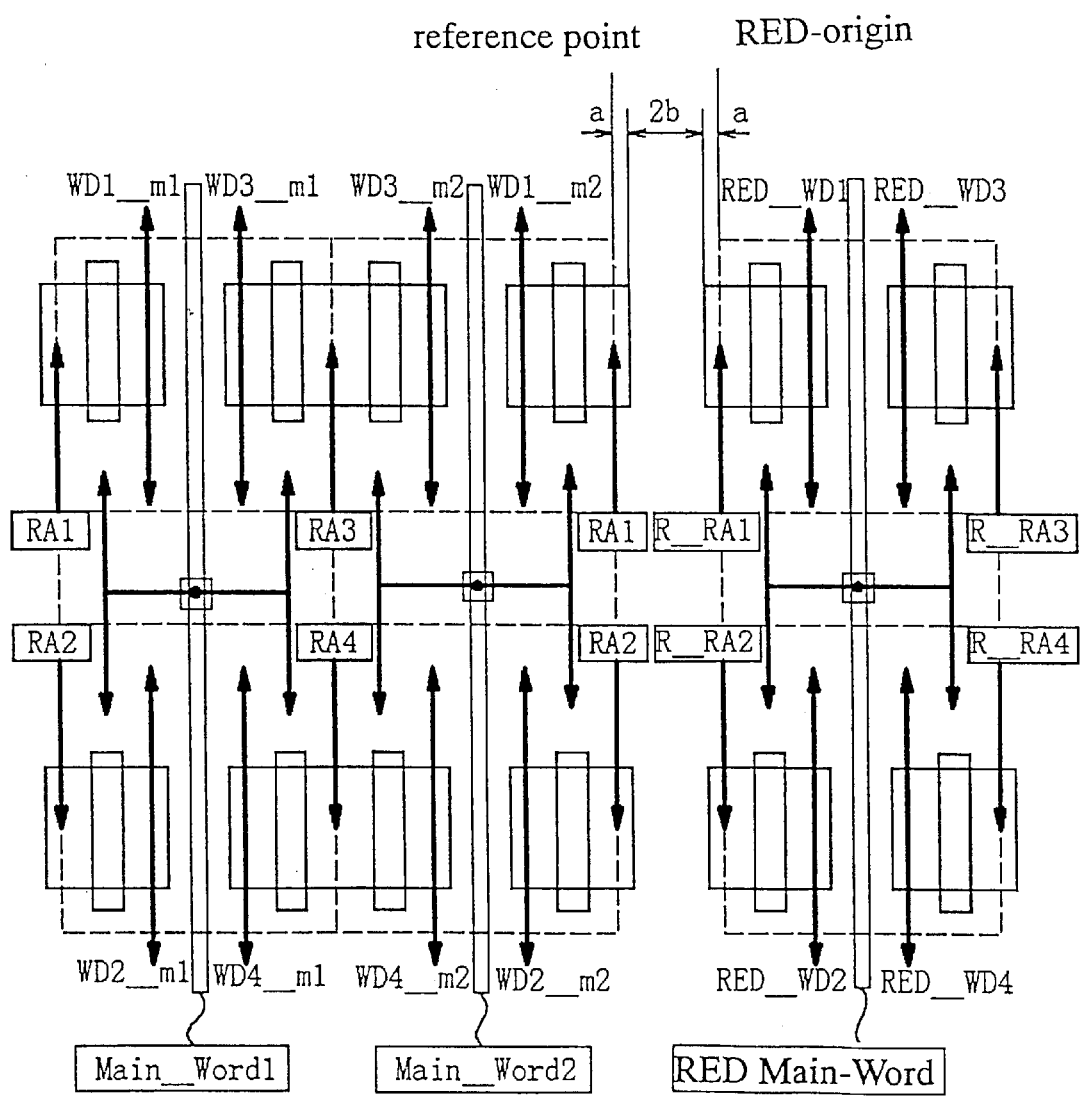
FIG. 6A is a schematic diagram illustrative of the conventional structure of the word driver (WDRV) and a redundancy word driver (RED-WDRV) adjacent to the word driver.
Figure 6B:
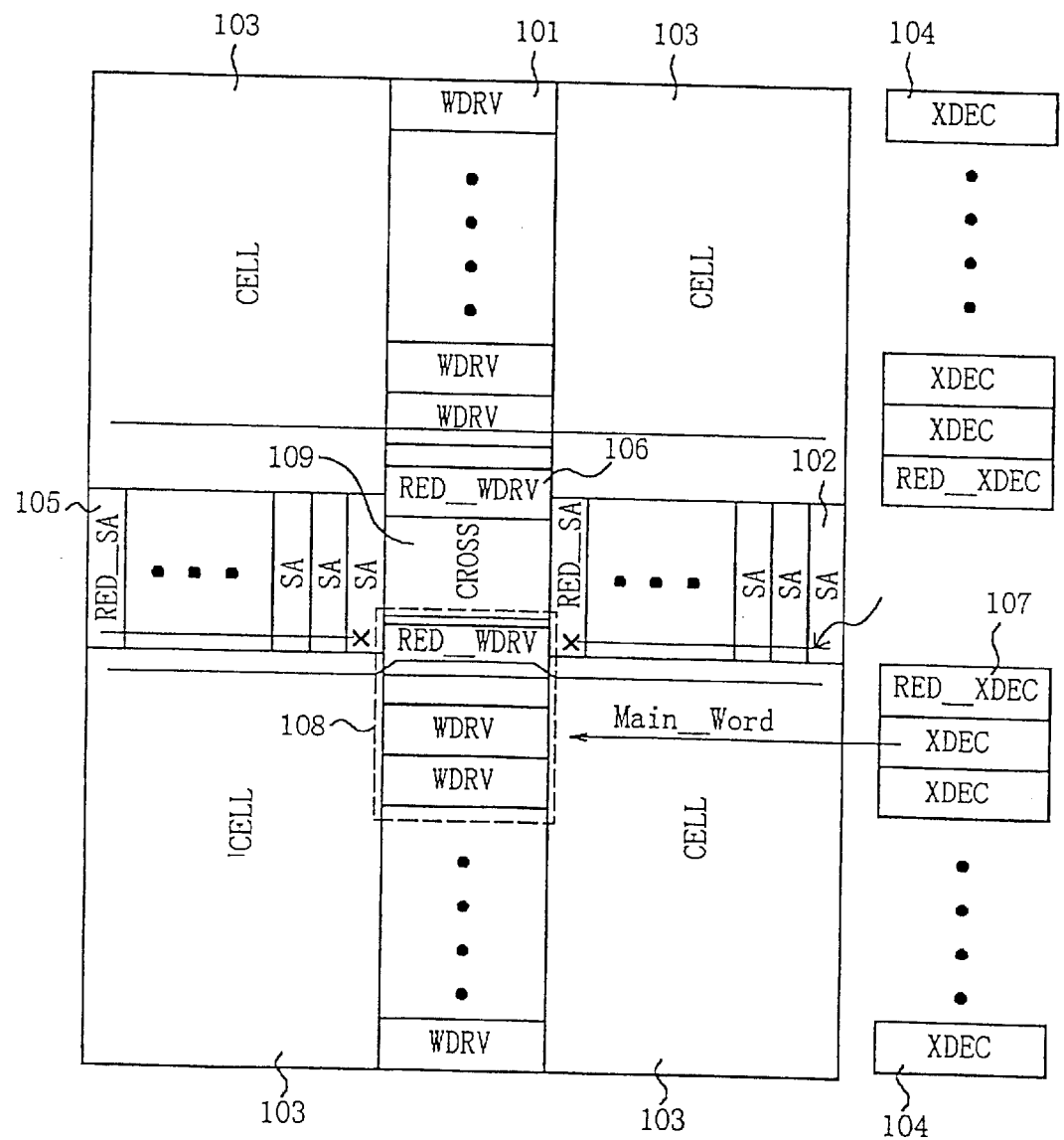
FIG. 6B is a diagram illustrative of the conventional placement of the semiconductor memory device.

With reference to FIGS. 5 and 8, the prior art and the present invention are compared to each other in the distance of an RED-origin from a reference point, wherein the reference point corresponds to a right side edge of the word driver basic cell adjacent to the redundancy word driver, whilst the RED-origin corresponds to a left side edge of the redundancy word driver. If a distance between the transistors is "$2b$", and extending distance from the boundary of the cell is "a", the conventional structure has a distance (a+$2b$+a) of the RED-origin from the reference point, whilst the novel structure has a distance (a+b) of the RED-origin from the reference point. Namely, the distance of the RED-origin from the reference point of the novel structure is smaller by (a+b) than the distance of the RED-origin from the reference point of the conventional structure. This relationship is also common to the left side of the word driver (WDRV) and the cross region (CROSS). Totally, the size of the novel structure is smaller in size by ($2a+2b$) than the conventional structure, whereby the amount of extension of the circuit elements and interconnections over the cross region (CROSS) and the displacement of the Word for the redundancy word driver are reduced.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device comprising:

memory cells;

main decoders decoding address signals;

sense amplifiers for reading out informations from the memory cells; and word drivers for driving the memory cells, wherein a row address controlled by a single main word line in a basic cell in the word driver, and two of the main word line of the row address are made correspond to a half of lower-order 2-bits of the row address, and a word driver signal is placed inside of the basic cell of the word driver to prevent the word driver signal from being commonly used to adjacent two of the basic cell.

2. The semiconductor memory device as claimed in claim 1, wherein two of the main word line are placed cross to each other, a remaining half of the lower-order 2-bits of the row address is controlled by an adjacent basic cell of the word driver, and the single basic cell of the word driver has different two main word lines having the same lower-order bits.

3. The semiconductor memory device as claimed in claim 1, wherein the word river signal is placed at almost center position of the basic cell of the word driver.

4. The semiconductor memory device as claimed in claim 1, wherein the semiconductor memory device comprises a virtual channel synchronous dynamic random access memory.

5. The semiconductor memory device as claimed in claim 1, wherein a redundancy word line is provided in correspondence with the main word line.

6. The semiconductor memory device as claimed in claim 5, wherein the redundancy word line includes a plurality of the main word line.

7. A word driver structure of a semiconductor memory device, wherein a row address controlled by a single main word line in a basic cell in the word driver, and two of the main word line of the row address are made correspond to a half of lower-order 2-bits of the row address, and a word driver signal is placed inside of the basic cell of the word driver to prevent the word driver signal from being commonly used to adjacent two of the basic cell.

8. The word driver structure as claimed in claim 7, wherein two of the main word line are placed cross to each other, a remaining half of the lower-order 2-bits of the row address is controlled by an adjacent basic cell of the word driver, and the single basic cell of the word driver has different two main word lines having the same lower-order bits.

9. The word driver structure as claimed in claim 7, wherein the word river signal is placed at almost center position of the basic cell of the word driver.

10. The word driver structure as claimed in claim 7, wherein the semiconductor memory device comprises a virtual channel synchronous dynamic random access memory.

11. The word driver structure as claimed in claim 7, wherein a redundancy word line is provided in correspondence with the main word line.

12. The word driver structure as claimed in claim 11, wherein the redundancy word line includes a plurality of the main word line.

* * * * *